United States Patent
Von Der Waydbrink et al.

(10) Patent No.: US 8,911,231 B2
(45) Date of Patent: Dec. 16, 2014

(54) SUBSTRATE TREATMENT INSTALLATION WITH ADJUSTABLE THERMAL INSULATION FOR CONTROLLING SUBSTRATE TEMPERATURE

(75) Inventors: Hubertus Von Der Waydbrink, Dresden (DE); Thomas Meyer, Dresden (DE); Michael Hentschel, Dresden (DE); Reinhardt Bauer, Dresden (DE); Andrej Wolf, Dresden (DE); Hans-Christian Hecht, Weinboehla (DE)

(73) Assignee: VON ARDENNE Anlagentechnik GmbH, Dresden (DE)

( * ) Notice: Subject to any disclaimer, the term of this patent is extended or adjusted under 35 U.S.C. 154(b) by 0 days.

(21) Appl. No.: 13/376,465

(22) PCT Filed: Jun. 18, 2010

(86) PCT No.: PCT/EP2010/058627
§ 371 (c)(1),
(2), (4) Date: Jan. 27, 2012

(87) PCT Pub. No.: WO2010/146151
PCT Pub. Date: Dec. 23, 2010

(65) Prior Publication Data
US 2012/0118541 A1    May 17, 2012

(30) Foreign Application Priority Data

Jun. 19, 2009 (DE) .................. 10 2009 029 908
Jun. 23, 2009 (DE) .................. 10 2009 030 194
Oct. 19, 2009 (DE) .................. 10 2009 049 954

(51) Int. Cl.
| | | |
|---|---|---|
| F24J 3/00 | (2006.01) | |
| F27D 1/12 | (2006.01) | |
| F27D 9/00 | (2006.01) | |
| C23C 14/54 | (2006.01) | |
| C23C 14/56 | (2006.01) | |

(52) U.S. Cl.
CPC ............... *C23C 14/541* (2013.01); *C23C 14/56* (2013.01)
USPC ............ 432/228; 432/233; 165/48.1; 165/86; 165/89; 427/374.1

(58) Field of Classification Search
USPC ...................... 165/48.1, 86, 89; 432/228, 233; 427/374.1
See application file for complete search history.

(56) References Cited

U.S. PATENT DOCUMENTS 4,971,555 A * 11/1990 Calamara ................... 432/59
5,079,817 A *  1/1992 Anstotz et al. .............. 165/89

(Continued)

FOREIGN PATENT DOCUMENTS

DE            4424768 C1    11/1995
DE     10 2008 039 430 A1     2/2009

(Continued)

OTHER PUBLICATIONS

International Search Report for PCT/EP2010/058627 dated Oct. 22, 2010.

*Primary Examiner* — Ljiljana Ciric
(74) *Attorney, Agent, or Firm* — Heslin Rothenberg Farley & Mesiti P.C.

(57) ABSTRACT

A substrate-treatment installation includes a vacuum chamber, a substrate treatment device within the vacuum chamber, a substrate transport device within the vacuum chamber for guiding a substrate along a longitudinal direction in a substrate transport plane past the substrate treatment device, and a device for controlling substrate temperature. The substrate temperature controlling device includes a heat-absorbing cooler on one side of the substrate transport plane and an insulation member selectively displaceable between at least two different positions to vary extent of thermal shielding of the heat-absorbing cooler relative to the substrate transport plane by the insulation member.

12 Claims, 3 Drawing Sheets

(56) References Cited

U.S. PATENT DOCUMENTS

| | | |
|---|---|---|
| 6,261,091 B1 * | 7/2001 | Sakamoto et al. ............ 432/121 |
| 2001/0023055 A1 * | 9/2001 | Sakamoto et al. .............. 432/18 |
| 2010/0062169 A1 | 3/2010 | Pierre |
| 2010/0226629 A1 * | 9/2010 | Basol et al. ................... 392/407 |

FOREIGN PATENT DOCUMENTS

| | | |
|---|---|---|
| EP | 0622128 A1 | 11/1994 |
| EP | 0918042 A1 | 5/1999 |

* cited by examiner

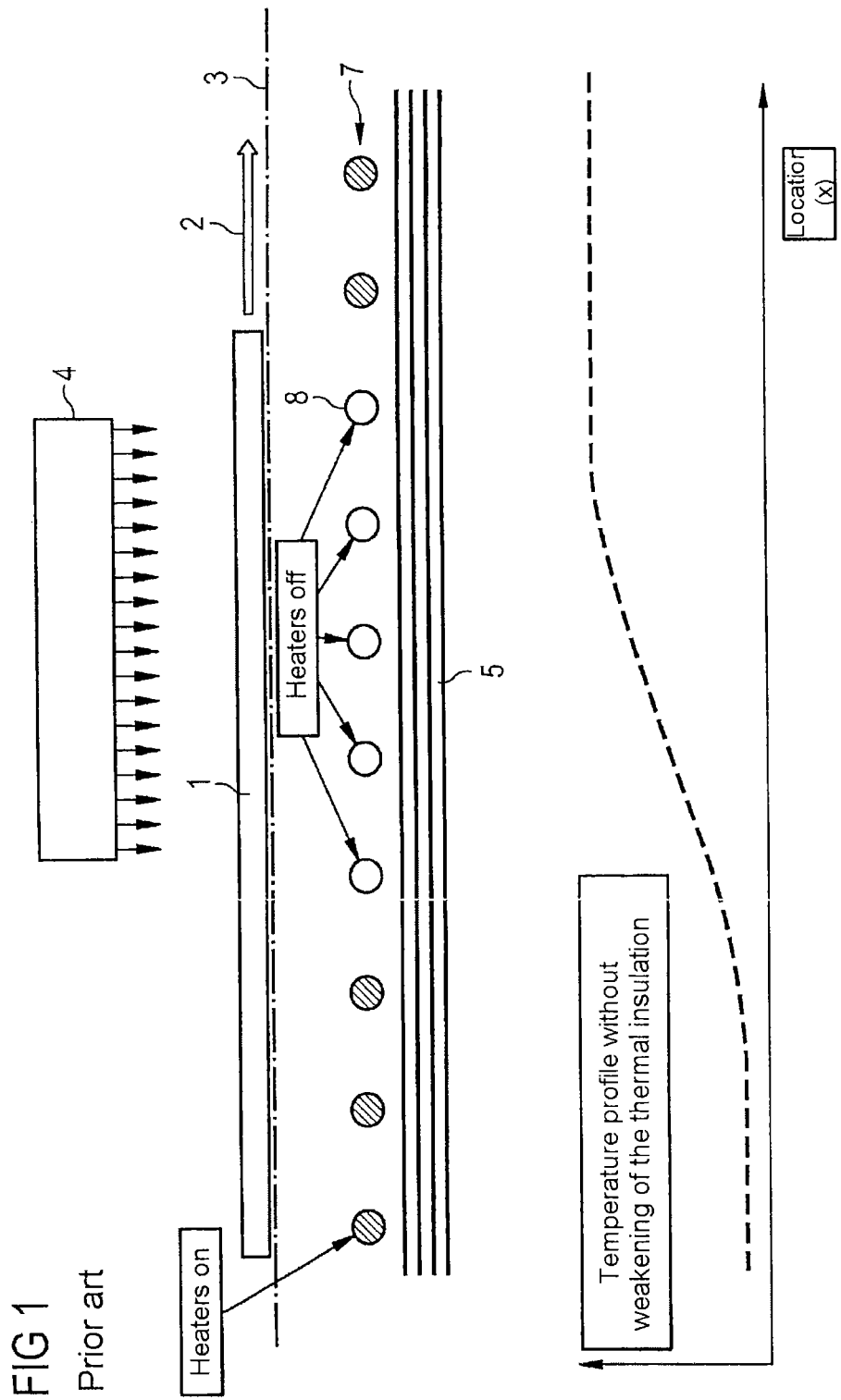

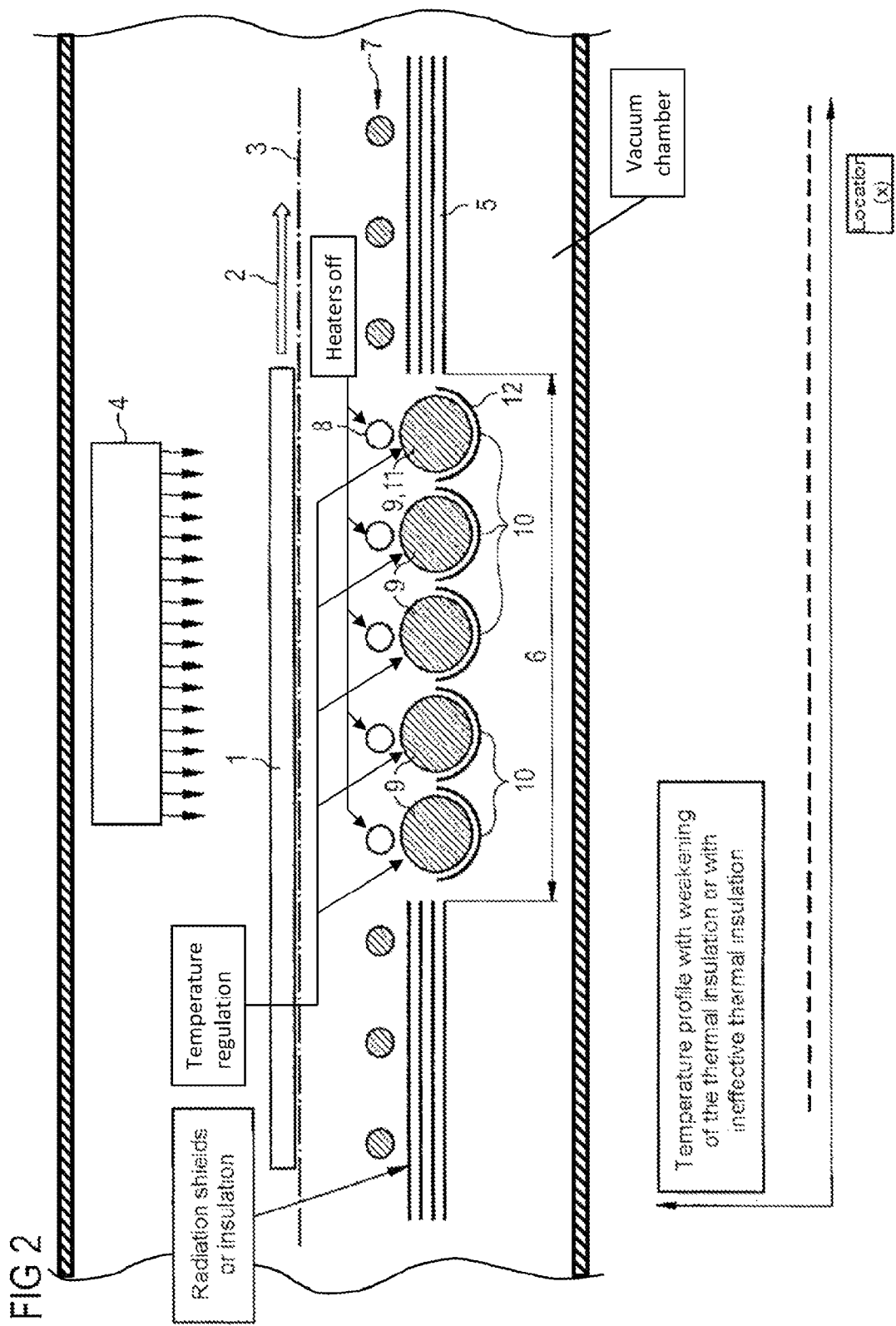

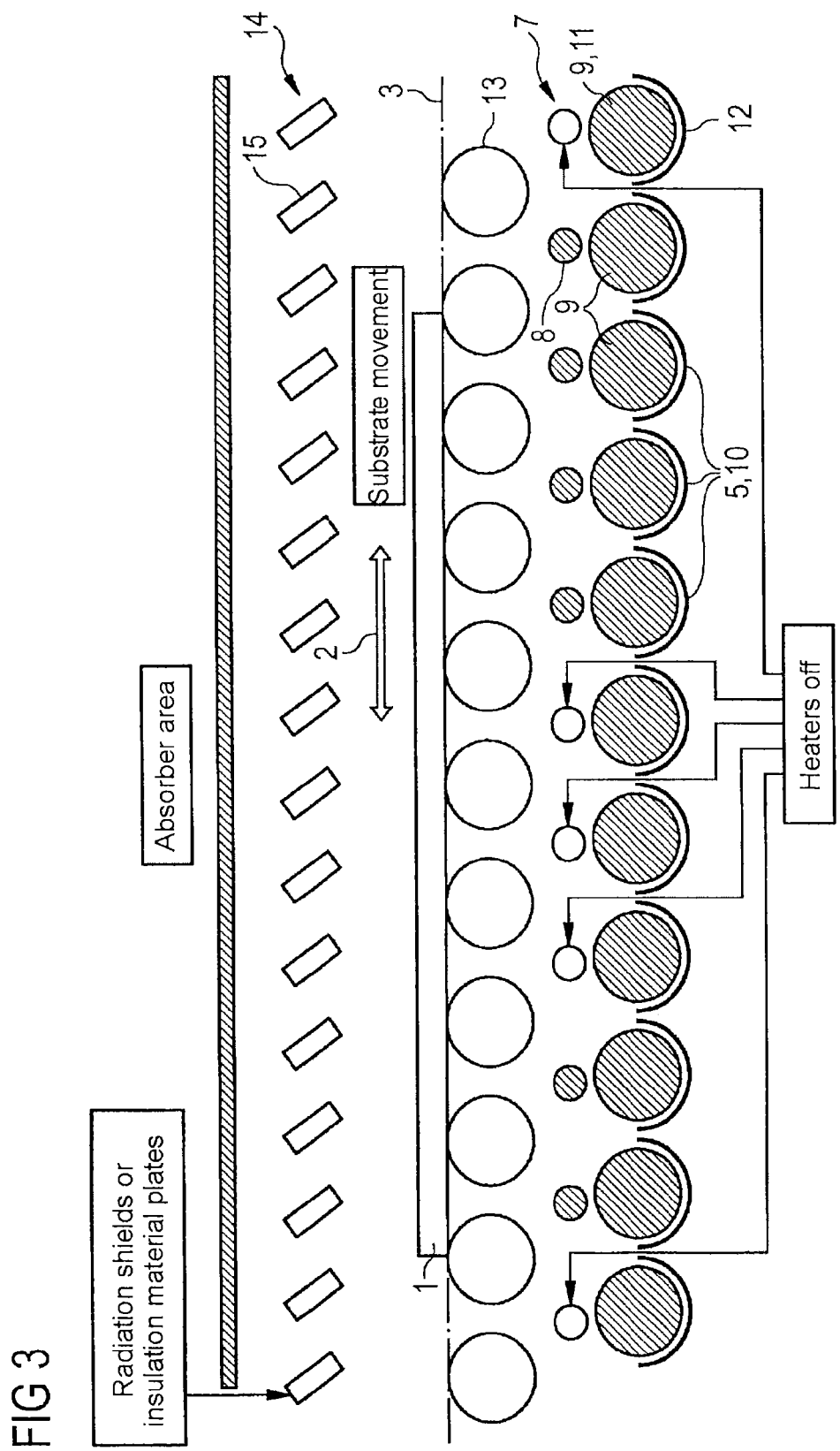

SUBSTRATE TREATMENT INSTALLATION WITH ADJUSTABLE THERMAL INSULATION FOR CONTROLLING SUBSTRATE TEMPERATURE

CROSS REFERENCE TO RELATED APPLICATIONS

This application is a national stage filing under section 371 of International Application No. PCT/EP2010/058627 filed on Jun. 18, 2010, and published in German on Dec. 23, 2010 as WO 2010/146151 A1 and claims priority of German application No. 10 2009 029 908.4 filed on Jun. 19, 2009, German application No. 10 2009 030 194.1 filed on Jun. 23, 2009 and German application No. 10 2009 049 954.7 filed on Oct. 19, 2009, the entire disclosure of these applications being hereby incorporated herein by reference.

BACKGROUND ART

The invention relates to a device for controlling the temperature of substrates in a substrate treatment installation, in which a substrate can be guided in the longitudinal extension of the substrate treatment installation in a substrate transport plane within a vacuum chamber past a treatment device.

Treatment devices are understood in this case as coating devices, such as vapor deposition or magnetron devices, but also temperature treatment devices, sputtering and etching devices and the like.

During the treatment of substrates in such substrate treatment installations, heating devices are used both for heating substrates to the temperature required for the process in order to obtain the desired properties, and for maintaining the substrate temperature while the substrate passes through the process of the treatment device.

The known devices for heating substrates in substrate treatment installations substantially consist of heating elements, radiation protective shields, and a baseplate on which the heating elements and radiation shields are mounted. The baseplate can be embodied in cooled fashion.

Alongside the heating of the substrate, it may be necessary to maintain the temperature of the substrate between two process locations or else to increase the substrate temperature.

They can be very different types of processes:

Heat treatments: maintaining a specific temperature/time regime in a vacuum or under defined process gas conditions.

Coating devices: Maintaining the temperature required for coating in particular at the process location, but also possibly in the region between different process locations e.g. in a substrate treatment installation designed as a continuous installation, if necessary for obtaining layer properties.

One problem when designing the heating is that the treatment devices themselves can constitute considerable heat sources. This is the case for example at process locations such as magnetron sputtering, vapor deposition, etc. Therefore, in substrate treatment installations designed as continuous installations, undesirable heating of the substrate can occur depending on the specific heat capacity of the substrate, transport speed and thermal power input from the substrate treatment devices. In principle, that can be combated by reducing the power of the heating devices behind the substrate or switching them off.

In the case of high heat input into the substrate through the treatment devices, it can furthermore become necessary to dissipate excess heat via the substrate rear side by means of emission. In a vacuum, this procedure is possible only within the limits set by the emission power on account of the great dependence on temperature. If e.g. the desired substrate temperature is 300° C., under corresponding preconditions an emission power of approximately 5 kW/m2 cannot be exceeded. If the heat inputs from the treatment devices exceed this power, substrate heating has to be accepted.

Depending on substrate temperature, the theoretically possible emission powers are considerably above that at relatively high substrate temperatures.

In substrate treatment installations which operate at relatively high process gas pressures, heat conduction by the process gas is increasingly manifested. That can be exploited by the substrate rear side being brought into thermal contact with components such as rollers, for example. The thermal contact is realized by the heat-conducting process gas. Substrate and component which can be temperature-regulated can be in mechanical contact, although the mechanical contact is not necessary depending on the desired heat dissipation, provided that the gap dimension between substrate rear side and component is correspondingly adapted.

In the case of the steady-state heating of a substrate, in part rapid heating to the temperature required for the subsequent process is desired. A correspondingly dimensioned heating system can achieve this objective. In the case of continuous installations, almost the entire cycle time is generally available for this purpose. Substrate by substrate is brought to process temperature in this way, the heated substrate is removed and moved in the direction of the process, and the chamber that has become free receives the next substrate for heating.

However, there may also be the requirement, for instance for the processing of individual substrates, not to remove the substrate from the heating chamber at high speed and feed it to the process. Rather, e.g. for the case where the process chamber directly adjoins the heater chamber, it may be necessary not to remove the substrate at high speed from the heating chamber, but rather to lead it out at a comparatively low process speed. For this operating case, although a heating system as described above can enable the substrate to be rapidly heated, the type of heating system has the disadvantage that the heating itself can have comparatively considerable heat capacities, such that the temperature of the substrate after the heating has been switched off after the desired substrate temperature has been attained can overshoot considerably depending on the specific relationships. By suitably throttling or else switching off the heating system before the desired substrate temperature is attained, although the heat stored in the heaters and radiation shields can be utilized for subsequent heating, such that the substrate temperature is attained without overshooting, these compensation processes can take up considerable amounts of time and are therefore unacceptable.

BRIEF SUMMARY OF INVENTION

Consequently, it is an object of the invention, in thermally assisted vacuum process technology, to dynamically fashion a control of the heat transfer in the substrate and in this case to reduce thermal inertias, in particular. Consequently the thermal conditions can be set in such a way that the requirements of the process can be taken into account better.

According to the invention, the object is achieved by virtue of the fact that on one side of the substrate transport plane a heat-absorbing cooling means is arranged.

If the heating device is switched off since the substrate has attained or exceeded a desired temperature, which can result from the heat input from the treatment device, the heating effect will very generally still continue for a time on account of the thermal inertia. During this time, the cooling device can take effect.

A further configuration of the invention provides for an insulation means to be arranged, by which the cooling means can be shielded at least partially relative to the substrate transport plane. With this insulation means, the cooling effect of the cooling means can be influenced in a targeted manner.

Heat-absorbing cooling means and insulation means can be used interactively. It is thus possible to switch on or off or reduce the effect of the cooling means relative to the substrate or the heating device, by the insulation means being set in such a way that it does not shield the cooling device. When a smaller cooling effect is required, the intensity of the cooling can be controlled with the shielding function of the insulation means.

In particular for controlling the intensity of the cooling, one embodiment of the invention provides for the insulation effect of the insulation means to be adjustable.

It can furthermore prove to be advantageous if the cooling means is provided with a temperature regulating means. Said temperature regulating means is able to influence the temperature of the cooling means and thus its cooling intensity in a targeted manner. As explained below, by way of example, heating that counteracts the cooling can act as temperature regulating means. When a fluid cooling means is used, too, its temperature can be adjusted, for example, likewise by a counter-heating. In these cases, the temperature regulating means should be seen in the cooling fluid and/or the counter-heating.

Substrate treatment installations designed as continuous installations have a longitudinal extension in the direction of which, i.e. the longitudinal direction, the substrate is moved on the substrate transport plane. One embodiment of the invention provides for the cooling means to consist of a cooling element extending in the direction of the longitudinal direction.

In order to increase the region of effect, provision can also be made for the cooling means to consist of a cooling element extending transversely with respect to the direction of the longitudinal direction.

Therefore, the cooling means can also have an extension in the longitudinal and transverse direction.

In any event, the cooling effect can thus be extended over an entire region.

In this case, one configuration provides for the cooling means to be embodied as a plate-type cooling element lying parallel to the substrate transport plane.

In another solution variant, the cooling means consists of a plurality of cooling elements arranged one behind another in the longitudinal direction. In this case, a configuration of the cooling elements as cooling pipes for a cooling medium constitutes a form that is expedient in terms of production.

Water can be used as a simple cooling medium, for which purpose, in one embodiment, the cooling pipes are designed such that water flows through them.

A further embodiment provides for the insulation means to consist of a plurality of insulation elements arranged one behind another in the longitudinal direction.

In particular in the case of a design comprising a plurality of cooling elements arranged one behind another in the longitudinal direction, a further variant provides for an insulation element to be assigned to each cooling element.

The influencing of the intensity of the cooling effect can be realized, in one embodiment, by virtue of the fact that an insulation element is designed to be adjustable between a position on a side of a cooling element that faces away from the substrate plane and a position on a side of the cooling element that faces the substrate plane.

However, the insulation means can also be embodied as an insulation louver with insulation elements as louver slats which are adjustable individually in groups or jointly.

If the cooling elements are embodied as cooling pipes, it is expedient for the insulation element to have the form of a cylinder segment in cross section. As a result, the insulation element can embrace the cooling element in a shell-like manner.

A further configuration provides for the insulation means to consist of two opposite and displaceable lattice-shaped insulation elements arranged parallel to the substrate transport plane. The lattice-shaped design and the relative displacability result in a continuously variable adjustment of the insulation effect, since, in one end position, both lattices lie congruently one above the other or, in another end position, both lattices cover each other and many other intermediate positions are possible therebetween.

For the case where the substrate is not intended to be cooled, but rather should also be heated, a further configuration provides for a heating element to be arranged between substrate plane and cooling means.

Alternatively, the heating element can be arranged on the side of the substrate transport plane that faces away from the cooling means.

In both cases, it is also possible for a plurality of heating elements to be arranged alongside one another in the longitudinal extension of the substrate treatment installation, which heating elements are expediently individually switchable individually or in groups.

In this case, it is possible for the heating device simultaneously to function as the temperature regulating device for the cooling means, that is to say to act as the counter-heating explained above.

In a further configuration, a thermal insulation is arranged on the side of the substrate transport plane that faces away from the treatment device parallel to the substrate transport plane, said thermal insulation being interrupted in the region lying opposite the heat source. This makes it possible for the substrate, via its side facing away from the treatment device, to emit the heat input into the substrate by the coating device, acting as a heat source, by means of thermal radiation. This is supported by the fact that the heat-absorbing cooling means with the insulation means is arranged in the interruption.

However, the stated object according to the invention is also achieved by virtue of the fact that a thermal insulation is arranged on the side of the substrate transport plane that faces away from the treatment device parallel to the substrate transport plane, said thermal insulation being interrupted in the region lying opposite the heat source. Detached from a heat-absorbing cooling means, this solution provides for achieving a permissible temperature in the substrate by means of emission in the region of the interruption. In this case, the interruption can also extend to further regions which in the transport direction behind the region lying opposite the heat source, if this is necessary for sufficient cooling-down.

BRIEF DESCRIPTION OF DRAWING FIGURES

The invention will be explained in greater detail below on the basis of an exemplary embodiment. In the associated drawings:

FIG. 1 shows a basic illustration of a heating device according to the prior art, FIG. 2 shows a basic illustration of a first solution according to the invention, and FIG. 3 shows a basic illustration of a second solution according to the invention.

DETAILED DESCRIPTION

FIG. 1 illustrates a device for controlling the temperature of substrates in a substrate treatment installation according to the prior art. In this case, a substrate 1 can be guided by a substrate transport device in the longitudinal extension 2 of the substrate treatment installation in a substrate transport plane 3 within a vacuum chamber (not illustrated in more specific detail) past a treatment device 4.

The treatment device 4 can constitute, for example, a magnetron or an evaporation device, or the like, which in turn constitutes a heat source. Solely by virtue of the substrate 1 being guided past the treatment device 4, said substrate is heated, possibly beyond a permissible maximum temperature.

A thermal insulation 5 is arranged on the side of the substrate transport plane 3 that faces away from the treatment device 4 parallel to the substrate transport plane 3. Said thermal insulation 5 serves to minimize an effect of the thermal radiation emerging from the warm substrate 1 on the rest of the vacuum chamber.

The thermal insulation 5 can consist of an insulation material that substantially prevents heat conduction, or else be embodied as a radiation shield that keeps a thermal radiation away from the rest of the vacuum chamber by means of back-reflection.

Therefore, this thermal insulation 5 is intended to have a thermal insulation effect such as is also achieved in the case of static devices (e.g. radiation shield assembly or insulating material layer).

FIG. 1 illustrates a heating device 7 that is customary in practice. The substrate 1, which moves past the treatment device 4, is heated. The reduction or else shutdown of the heaters 8 does not lead to the desired result of a constant temperature in the transport direction. Depending on the transmitted thermal power, substrate heat capacity, emission conditions, the increase in temperature can differ greatly.

In principle, the heating of the substrate 1 can, according to the invention and as is illustrated in FIG. 2, depending on the transmitted thermal power, substrate heat capacity, emission conditions, be prevented by weakening or completely dispensing with the insulation in the region of the heat source. Furthermore, it is possible for the region of the heat source, which is illustrated in a very greatly simplified manner in the drawing, itself to have shields whose thermal equilibrium is established only during ongoing operation of the substrate treatment installation.

FIG. 2 indicates how the outlined problems and disadvantages of an arrangement according to the prior art in accordance with FIG. 1 can be overcome.

In accordance with FIG. 2, the thermal insulation 5 on that side of the substrate transport plane 3 which faces away from the treatment device 4 is interrupted in the region which lies opposite the treatment device 4 as a heat source. As a result of this interruption 6, the intention, depending on the requirements, is to make possible a maximum heat transfer, that is to say that the insulation effect is intended to be considerably reduced or eliminated. In this case, it is desirable to provide the interruption with gradual transitions in which the insulation effect slowly decreases. An as far as possible continuously variable setting of the insulation effect between the extreme values mentioned —full insulation and non-insulation —can thus be achieved.

This gives rise to making possible a conditioning phase during which firstly the insulation effect is weakened only slightly. Steady-state conditions arise only after this phase has been performed. That can be realized much faster with a controllable thermal insulation than with a non-controllable thermal insulation, which can only take account of the steady-state case, but does not support a rapid thermal settling.

As can be seen from FIG. 2, there is arranged in the interruption 6 on one side of the substrate transport plane 3 a heat-absorbing cooling means 9 and also an insulation means 10, by which the cooling means 9 can be shielded at least partially relative to the substrate transport plane 3. The cooling means 9 consists of a plurality of cooling elements 11 arranged one behind the other in the longitudinal direction 2, said cooling elements being embodied as cooling pipes. In this case, an insulation element 12 is assigned to each cooling element 11. Each insulation element 12 is designed to be adjustable between a position on a side of a cooling element 11 that faces away from the substrate transport plane 3 and a position on a side of the cooling element 11 that faces the substrate transport plane 3. In a manner matching the cooling pipes 11, the insulation elements 12 have the form of a cylinder segment.

In the switching state "thermal insulation ON", all the insulation elements 12 are pushed over the cooling elements 11, such that they cover the cooling elements 11 on that side thereof which faces the treatment device 4. This corresponds to the heating in the customary arrangement as illustrated in FIG. 1. Behind the heaters 8, in order to reduce the thermal losses, insulation elements 12 in the form of radiation shield assemblies or insulating material caps are situated on the cooling elements 11, here embodied as cooling pipes.

In the switching state "thermal insulation off", the insulation elements 12, that is to say the shield assemblies or insulating material caps, are rotated onto the side facing away from the substrate 1 or the substrate transport plane 3. In this case, the insulation elements 12 can also be e.g. an extended cold plate.

In this switching state, the rear side of the substrate 1 can emit onto the cold areas. Depending on the application, it can be expedient to provide for a high absorptivity of this cold area. In this connection, it should be noted that the designation "cold areas" means that said areas have to have a temperature which actually enables heat to be emitted, such that, depending on the specific conditions, said areas in the case of high-temperature applications might perfectly well have temperatures of several 100° C.

The adaptation of the insulation effect can be changed by the arrangement within wide limits, by bringing the insulation elements 12', that is to say the radiation shield assemblies or insulating material caps, to the corresponding angular position by rotating the cooling elements 11. In the case of an intermediate position thus set, depending on the angle, part of the substrate radiation is absorbed or is largely reflected in the region of a shielding insulation element 12.

The devices for weakening the thermal insulation which lie alongside one another in the transport direction, such as are formed here as cooling element 11 with insulation element 12, can be individually adjustable in order to be able to locally adjust the heat outflow with the aim of keeping the substrate heating constant at every location, since the thermal loading of the substrate 1 hardly vary under a heat source along the transport direction 2. The heat input by means of the treatment device 4 can vary over the length in the transport direction 2 of said treatment device 4. If the substrate temperature is intended to be kept constant, the need arises to compensate for the local heat input by means of a local heat outflow that is identical in terms of magnitude. This can be accomplished if the cooling elements 11 are individually adjustable.

Besides the embodiment illustrated here as cooling element 11 with insulation element 12, the devices for altering the thermal insulation can furthermore be embodied very differently. For example as pipes with rotatable shields or insulating material caps or else as rotatable shields or insulating material caps with a cold plate situated behind them, or as a louver or two lattices displaceable with respect to one another.

FIG. 2 indicates by way of example in the lower diagram how a temperature profile measured in practice could be established, wherein here the thermal insulation was set to be virtually completely ineffective in the region of the interruption (in particular by means of a position of the insulation elements 12 relative to the cooling elements 11).

FIG. 3 schematically illustrates a second embodiment according to the invention with a heating/cooling apparatus. Controlled substrate cooling is thereby possible.

The substrate 1, e.g. a glass plate, lies on e.g. ceramic transport rollers 13 of a substrate transport device and can perform an oscillating movement. In this example, the upper controllable thermal insulation 14 consists of e.g. rotatably mounted insulation elements 15 such as radiation protective shields or of insulting material plates. The lower controllable thermal insulation 5 corresponds to the device described above. The specific mechanical embodiment is unimportant provided that the controllability of the thermal insulation is ensured. The controlled cooling can proceed as follows.

The thermal insulation is firstly in the state "thermal insulation ON". The upper insulation elements 15 lie horizontally, and the lower insulation elements 12 are rotated upward. The heaters 8 are switched on and temperature-regulated such that the substrate 1 now moving in is firstly kept at its temperature.

The heaters 8 are switched off, and the entire thermal insulation is adjusted in terms of its effect such that the substrate 1 is cooled at a defined rate. The rollers 13 impede the heat flow downward, but the substrate 1 is subjected to an oscillating movement, such that the rollers 13 can emit downward and thus be cooled. The heat flow downward can be increased if the distance between the rollers 13 is chosen to be greater. Furthermore, by means of a corresponding configuration of the rollers 13, the heat flow can be increased if a roller 13 is embodied e.g. as a thin-walled cylinder. In this case, the cylinder surface regions which can in each case emit to the cold area are cooled to a greater extent and can, after they have been exposed to the substrate thermal radiation again as a result of the rotational movement, take up more heat. Depending on the application, cylinder wall thickness/diameter, material and oscillating speed should be chosen suitably in order to obtain the desired thermal behavior.

After the desired temperature has been attained, the substrate 1 is moved out of the chamber and subjected to further cooling, e.g. convection cooling, or moved directly out of the substrate treatment installation into the surrounding atmosphere. The device also enables heating cycles, for instance in order to subject the substrate 1 to a treatment in a defined process gas atmosphere at an elevated temperature. For this purpose, the thermal insulation at the top 14 and at the bottom 5 is switched on, as are the heaters 8, in order to regulate the temperature of the substrate 1 to the desired temperature. After the treatment of the substrate 1 has been effected, the cooling can be effected as described above.

The invention claimed is:

1. A substrate treatment installation comprising: a vacuum chamber, a substrate treatment device within the vacuum chamber, a substrate transport device within the vacuum chamber for transporting a substrate along a longitudinal direction in a substrate transport plane past the substrate treatment device, and a substrate temperature controlling device within the vacuum chamber for controlling temperature of the substrate, the substrate temperature controlling device comprising cooling means for absorbing heat on one side of the substrate transport plane, and insulation means selectively displaceable between at least two different operative positions to vary extent of thermal shielding of the cooling means relative to the substrate transport plane, by the insulation means.

2. The substrate treatment installation as claimed in claim 1, wherein the cooling means is provided with means for temperature regulation that adjusts a temperature of the cooling means.

3. The substrate treatment installation as claimed in claim 1, wherein the cooling means comprises a plurality of cooling elements arranged one behind another in the longitudinal direction.

4. The substrate treatment installation as claimed in claim 3, wherein the cooling elements comprise cooling pipes for a cooling medium.

5. The substrate treatment installation as claimed in claim 3, wherein an insulation element is assigned to each cooling element.

6. The substrate treatment installation as claimed in claim 5, wherein an insulation element is displaceable between a first position on a side of a cooling element that faces away from the substrate transport plane and a second position on a side of the cooling element that faces the substrate transport plane.

7. The substrate treatment installation as claimed in claim 6, wherein the insulation element has the form of a cylinder segment.

8. The substrate treatment installation as claimed in claim 1, wherein the insulation means comprises a plurality of adjustable insulation elements arranged one behind another in the longitudinal direction.

9. The substrate treatment installation as claimed in claim 1, wherein a heating device is arranged between the substrate transport plane and the cooling means and employed to regulate temperature of the cooling means.

10. The substrate treatment installation as claimed in claim 9, wherein the heating device comprises a plurality of heating elements arranged alongside one another in the longitudinal direction.

11. The substrate treatment installation as claimed in claim 1, wherein a thermal insulation is arranged on a side of the substrate transport plane that faces away from the treatment device parallel to the substrate transport plane, said thermal insulation being interrupted in an interruption region lying opposite the treatment device, and the heat-absorbing cooling means with the insulation means is arranged in the interruption region.

12. The substrate treatment installation as claimed in claim 1, wherein said at least two different operative positions comprise a first position on a side of the cooling means that faces away from the substrate treatment plane, and a second position on a side of the cooling means that faces the substrate transport plane.

* * * * *